United States Patent
Chi (10) Patent No.: US 8,116,146 B2
(45) Date of Patent: Feb. 14, 2012

(54) SEMICONDUCTOR DEVICE AND METHOD FOR DRIVING THE SAME

(75) Inventor: Sung-Soo Chi, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 16 days.

(21) Appl. No.: 12/345,692

(22) Filed: Dec. 30, 2008

(65) Prior Publication Data

US 2009/0303804 A1 Dec. 10, 2009

(30) Foreign Application Priority Data

Jun. 4, 2008 (KR) .................. 10-2008-0052762
Dec. 18, 2008 (KR) .................. 10-2008-0129523

(51) Int. Cl.
*G11C 5/14* (2006.01)
(52) U.S. Cl. ......... 365/189.09; 365/189.11; 365/189.06; 365/230.06; 327/530
(58) Field of Classification Search ............. 365/189.09, 365/189.11
See application file for complete search history.

(56) References Cited

U.S. PATENT DOCUMENTS

| | | | |
|---|---|---|---|
| 5,663,911 A * | 9/1997 | Kaneko | ............. 365/189.11 |
| 5,828,614 A | 10/1998 | Gradinariu | |
| 6,275,429 B1 | 8/2001 | Bae et al. | |
| 6,570,916 B1 | 5/2003 | Feldbaumer et al. | |
| 7,501,881 B2 * | 3/2009 | Youn et al. | ............. 327/536 |

FOREIGN PATENT DOCUMENTS

| | | | |
|---|---|---|---|
| JP | 2005-276348 | | 10/2005 |
| KR | 10-0336786 | * | 5/2002 |
| KR | 1020070036576 | | 4/2007 |
| KR | 100764384 | | 9/2007 |

OTHER PUBLICATIONS

Notice of Preliminary Rejection issued from Korean Intellectual Property Office on Jun. 29, 2010.

* cited by examiner

*Primary Examiner* — Hoai V Ho
*Assistant Examiner* — Kretelia Graham
(74) *Attorney, Agent, or Firm* — IP & T Group LLP

(57) ABSTRACT

A semiconductor device includes an overdriving control circuit configured to generate a first drive signal and a second drive signal in response to an internal signal of an active command mode, an equalizing signal generating unit configured to generate an equalizing signal which is controlled with an overdriving voltage VPP level higher than a normal drive voltage during a first duration of an activation period and with the normal drive voltage VDD during a second duration of the other activation period after the first duration in response to the first drive signal and the second drive signal, and an equalization unit configured to equalize first and second lines in response to the equalizing signal.

20 Claims, 8 Drawing Sheets

SEMICONDUCTOR DEVICE AND METHOD FOR DRIVING THE SAME

CROSS-REFERENCES TO RELATED APPLICATION

The present invention claims priority of Korean patent application numbers 10-2008-0052762 and 10-2008-0129523, filed on Jun. 4, 2008 and Dec. 18, 2008, which are incorporated by reference in their entirety.

BACKGROUND OF THE INVENTION

The present invention relates to a semiconductor and a method for driving the same, and more particularly, to a bit line equalizer for a semiconductor device.

Semiconductor memory devices define a precharge time (TRP). The precharge time (TRP) is used as one of criteria for estimating operating speed of semiconductor devices and semiconductor memory devices. As semiconductor devices and semiconductor memory devices are more highly integrated and operate at a higher speed, a voltage level of an externally applied power supply voltage is lowered. As a result, as internal circuits of the semiconductor devices operate at the lowered power supply voltage, the specification of the precharge time (TRP) becomes difficult to satisfy.

Figure 1:
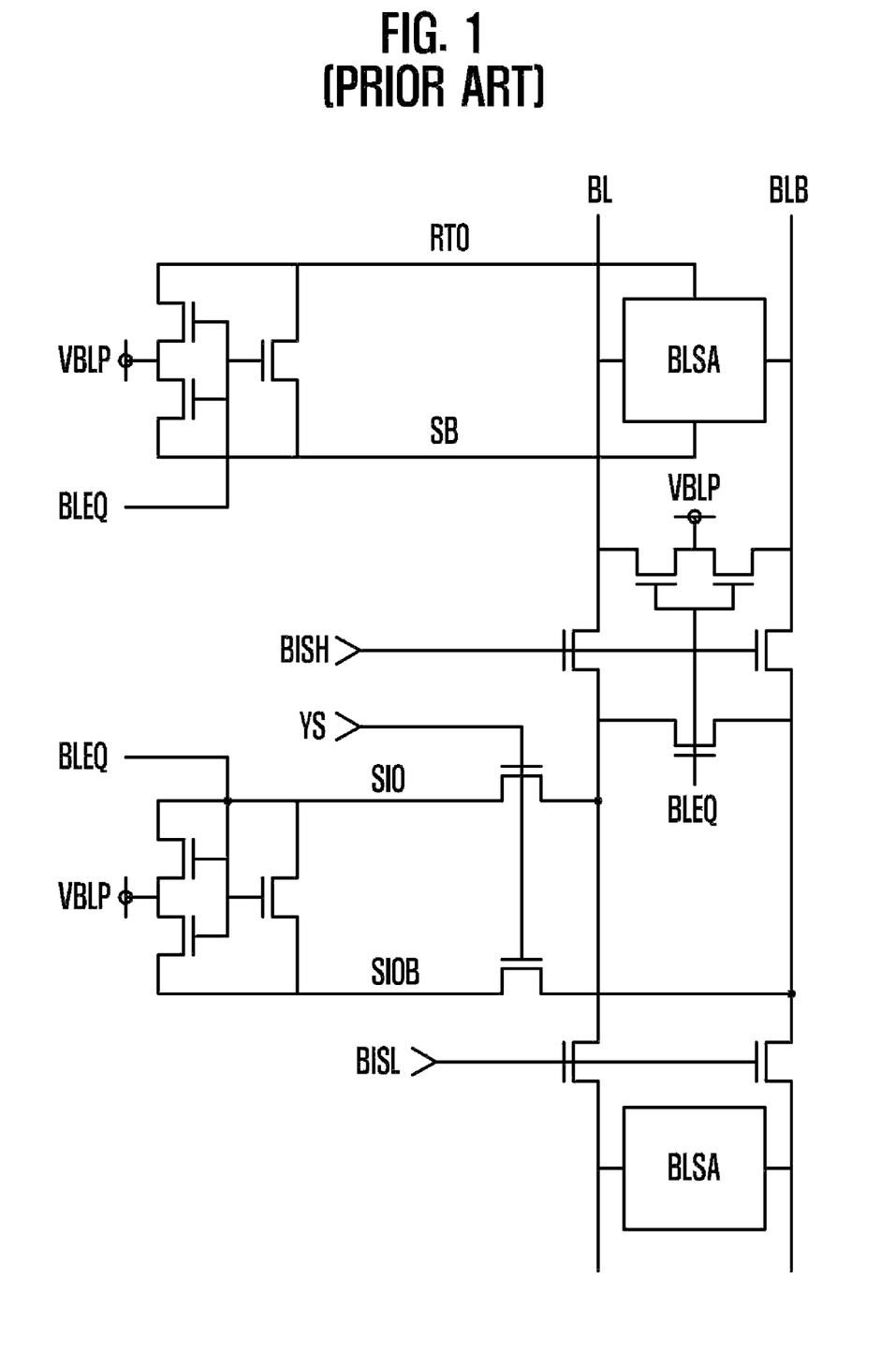
FIG. 1 is a circuit diagram of a core region of a conventional semiconductor memory device.

FIG. 1 is a circuit diagram of a core region of a conventional semiconductor memory device. As shown, bit lines BL and BLB and a pull-up power line RTO and a pull-down power line SB of a bit line sense amplification unit BLSA are equalized with a precharge voltage VBLP in response to a bit line equalization drive signal BLEQ.

BISH, YS, SIO and SIOB in FIG. 1 are a bit line separation high signal, a column selection signal and a segment data bus pair, respectively.

Figure 2:
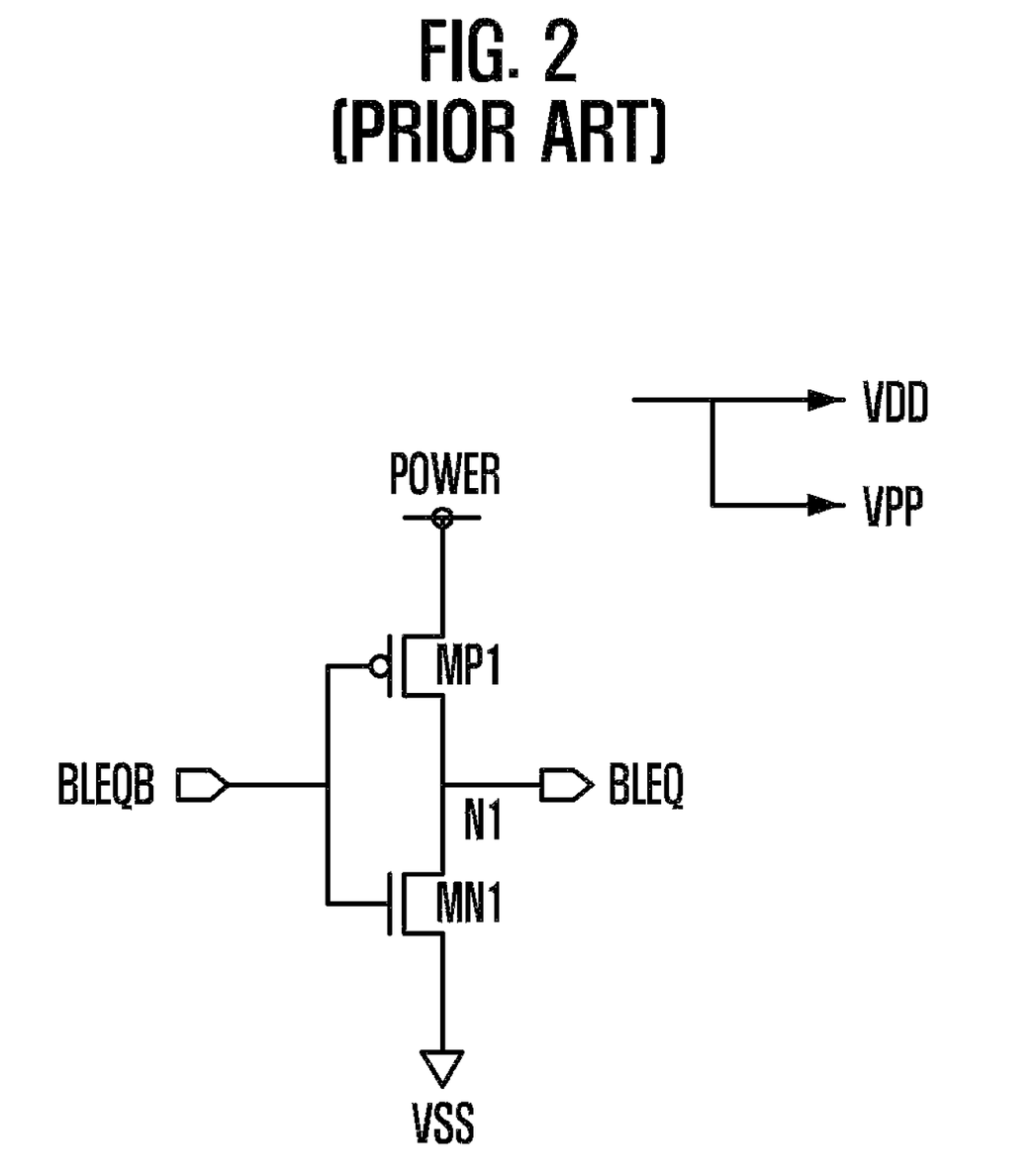
FIG. 2 is a circuit diagram of a conventional bit line equalization drive circuit.

FIG. 2 is a circuit diagram of a conventional equalizing signal generating unit. As shown, the conventional equalizing signal generating unit includes a first PMOS transistor MP1 and a first NMOS transistor MN1. The first PMOS transistor MP1 forms a current path between a power supply voltage terminal POWER and a node N1 in response to a drive signal BLEQB. The first NMOS transistor MN1 forms a current path between a ground voltage terminal VSS and the node N1 in response to the drive signal BLEQB.

The conventional equalizing signal generating unit outputs a bit line equalization drive signal BLEQ through the node N1 in response to the drive signal BLEQB. A boosted voltage VPP or a power supply voltage VDD is generally used as the voltage at the power supply voltage terminal POWER. The boosted voltage VPP has low efficiency because it is generated by boosting the power supply voltage VDD in the semiconductor device. Nevertheless, in a case where the precharge time (TRP) is important, the conventional equalizing signal generating unit needs to use the boosted voltage VPP.

When the boosted voltage VPP is used as an operation power source of the bit line equalization drive circuit, the precharge time (TRP) easily can be satisfied, although current consumption may be increased. On the contrary, when the power supply voltage VDD is used as an operation power source of the bit line equalization drive circuit, because the voltage level of the supply voltage VDD is low, the precharge time (TRP) may become difficult to satisfy although the current consumption may be reduced.

Figure 3:
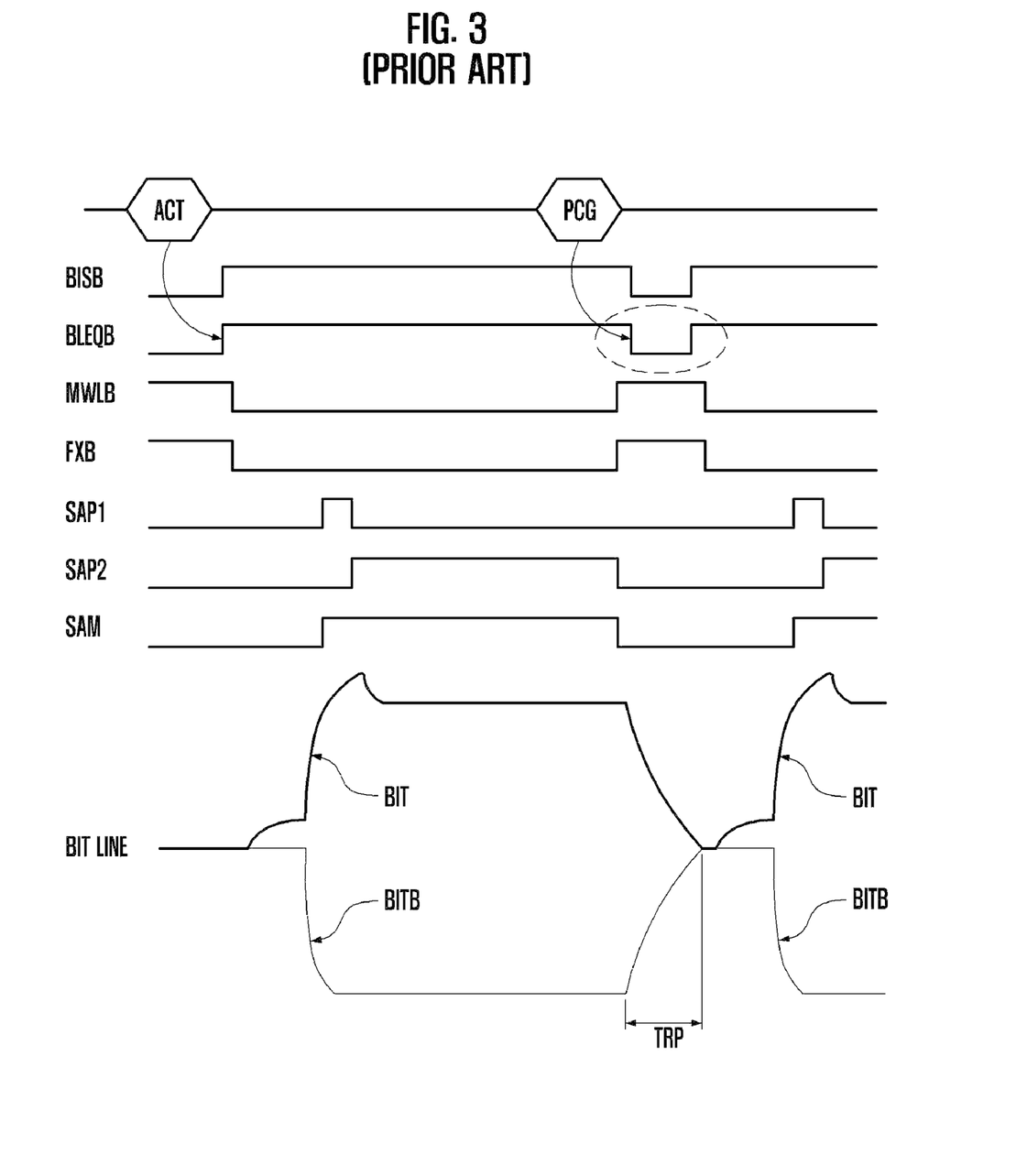
FIG. 3 is a timing diagram illustrating internal operations of a conventional semiconductor memory device.

FIG. 3 is a timing diagram illustrating internal operations of a conventional semiconductor memory device. Referring to FIG. 3, a precharge command PCG is applied, for example, after a precharge time (TRP) from the application of an active command ACT. If the precharge operation is performed late, the next active command is applied late, which results in deterioration of the operation characteristics.

SUMMARY OF THE INVENTION

Embodiments of the present invention are directed to providing a bit line equalizer for a semiconductor device, operating at high speed with low power consumption.

In accordance with an aspect of the invention, a semiconductor device includes an overdriving control circuit configured to generate a first drive signal and a second drive signal in response to an internal signal of an active command mode, an equalizing signal generating unit configured to generate an equalizing signal which is controlled with an overdriving voltage VPP level higher than a normal drive voltage during a first duration of an activation period and with the normal drive voltage VDD during a second duration of the other activation period after the first duration in response to the first drive signal and the second drive signal, and an equalization unit configured to equalize first and second lines in response to the equalizing signal.

A typical bit line equalizer uses a boosted voltage (VPP) or a supply voltage (VDD) as an operation power of a bit line equalization circuit. However, the bit line equalizer in accordance with the embodiments utilizes both the boosted voltage (VPP) and the supply voltage (VDD) as the operation power of the bit line equalization drive circuit. That is, the bit line equalization drive signal BLEQ generated by the bit line equalization drive circuit has the boosted voltage (VPP) level in an early stage of the activation period, and then has the supply voltage (VDD) level. Accordingly, in the early stage, the equalization elements enabled in response to the bit line equalization drive signal BLEQ are controlled with the boosted voltage VPP so that they can operate at a high speed. Thereafter, they are controlled with the supply voltage VDD to reduce the current consumption.

DESCRIPTION OF SPECIFIC EMBODIMENTS

Hereinafter, a bit line equalizer for a semiconductor device in accordance with the present invention will be described in detail with reference to the accompanying drawings. In general, a logic signal of a digital circuit has either a logic high level (denoted as 'H' or '1') or a logic low level (denoted as 'L' or '0') corresponding to a voltage level. The logic signal may also have a high impedance (HI-Z) state. A P-channel Metal Oxide Semiconductor (PMOS) and an N-channel Metal Oxide Semiconductor (NMOS) are used as a sort of a Metal Oxide Semiconductor Field-Effect Transistor (MOSFET) in the present invention.

Figure 4:
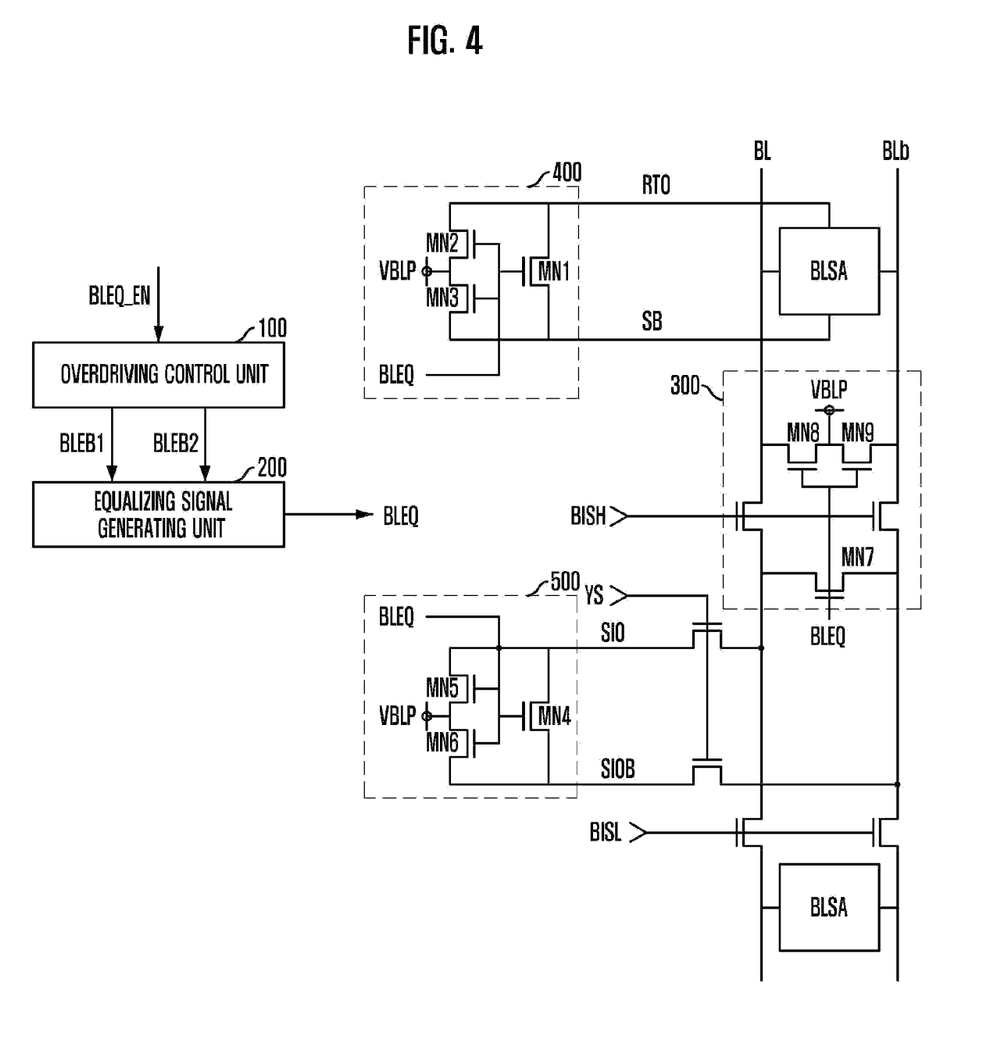
FIG. 4 is a circuit diagram of a semiconductor memory device in accordance with an embodiment of the present invention.

FIG. 4 is a circuit diagram of a semiconductor memory device in accordance with an embodiment of the invention.

The semiconductor memory device includes an overdriving control unit 100, an equalizing signal generating unit 200, a first equalizing unit 300, a second equalizing unit 400 and a third equalizing unit 500.

The overdriving control unit 100 generates a first drive signal BLEB1 and a second drive signal BLEB2 in response to an internal signal BLEQ_EN of an active command mode. The equalizing signal generating unit 200 generates an equalizing signal BLEQ which is controlled with an overdriving voltage VPP level higher than a normal drive voltage VDD during a first duration as an activation period and with the normal drive voltage VDD during a second duration as the other activation period after the first duration in response to the first drive signal BLEB1 and the second drive signal BLEB2. The first equalizing unit 300 equalizes bit lines BL and BLB in response to the equalizing signal BLEQ. The second equalizing unit 400 equalizes the pull-up power line RTO and the pull-down power line SB of a bit line sense amplification unit BLSA in response to the equalizing signal BLEQ. The third equalizing unit 500 equalizes a first data transfer line SIO for transferring data to a positive bit line BL and a second data transfer line SIOB for transferring data to a negative bit line BLB in response to the equalizing signal BLEQ.

The overdriving voltage VPP is a voltage internally generated by using the normal drive voltage VDD provided from an external and is a level higher than the normal voltage. If the overdriving voltage VPP of a high voltage level is excessively used, although a circuit is operated at a high speed, a current consumption efficiency of the overdriving voltage VPP becomes low. Accordingly, a use time of the overdriving voltage VPP is minimized.

A configuration and a main operation of the semiconductor memory device will be described in detail below.

The first equalizing unit 300 includes a plurality of precharge transistors MN8 and MN9 and a first equalizing transistor MN7. The plurality of precharge transistors MN8 and MN9 apply a precharge voltage VBLP to the positive bit line BL and the negative bit line BLB in response to the equalizing signal BLEQ. The first equalizing transistor MN7 forms a current path between the positive bit line BL and the negative bit line BLB in response to the equalizing signal BLEQ.

The second equalizing unit 400 includes a plurality of precharge transistors MN2 and MN3 and a second equalizing transistor MN1. The plurality of precharge transistors MN2 and MN3 apply the precharge voltage VBLP to the pull-up power line RTO and the pull-down power line SB of the bit line sense amplification unit BLSA in response to the equalizing signal BLEQ. The second equalizing transistor MN1 forms a current path between the pull-up power line RTO and the pull-down power line SB in response to the equalizing signal BLEQ.

The third equalizing unit 500 includes a plurality of precharge transistors MN5 and MN6 and a third equalizing transistor MN4. The plurality of precharge transistors MN5 and MN6 apply the precharge VBLP to the first data transfer line SIO and the second data transfer line SIOB in response to the equalizing signal BLEQ. The third equalizing transistor MN4 forms a current path between the first data transfer line SIO and the second data transfer line SIOB in response to the equalizing signal BLEQ.

When the equalizing signal BLEQ is activated to a logic high level, the first to third equalizing transistors MN7, MN1 and MN4 are turned on and identically equalize a voltage of two lines coupled. Also, when the equalizing signal BLEQ is activated to the logic high level, the precharge transistors MN8, MN9, MN2, MN3, MN5 and MN6 are turned on and apply the precharge voltage VBLP to the two lines coupled. That is, the equalizing transistors MN7, MN1 and MN4 perform an equalizing operation when the equalizing signal BLEQ is activated to a logic high level and disconnect the two lines when the equalizing signal BLEQ is deactivated to a logic low level. The precharge transistors MN8, MN9, MN2, MN3, MN5 and MN6 perform a sub operation by maintaining the two lines (e.g., BISH and BISL in FIG. 4) to be the precharge voltage VBLP while a current leakage and a noise occur. Here, BISH and BISL are a bit line separation high signal and a bit line separation low signal, respectively.

Figure 5:
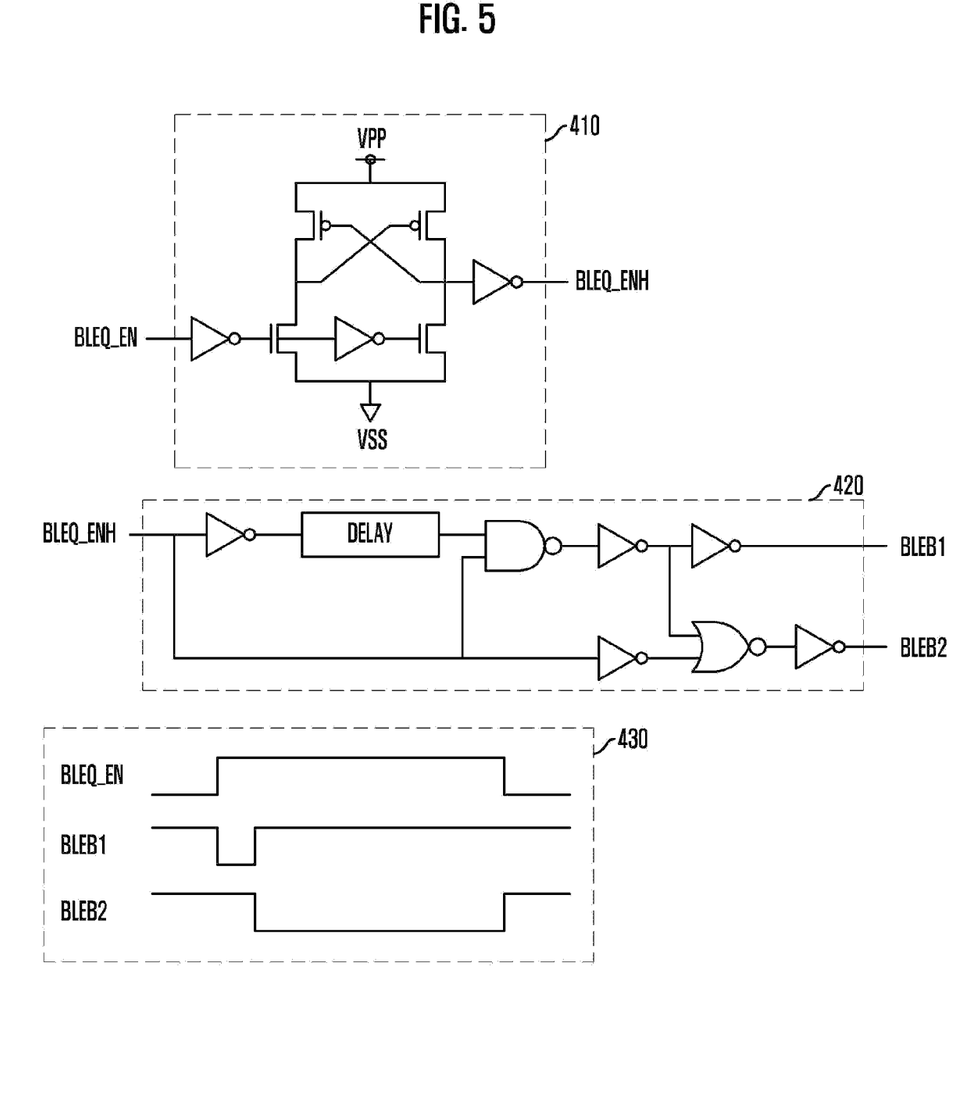
FIG. 5 is a circuit diagram in accordance with a first embodiment of the overdriving control unit shown in FIG. 4.

FIG. 5 is a circuit diagram in accordance with an embodiment of an overdriving control unit shown in FIG. 4.

As shown, the overdriving control unit 100 generates the first drive signal BLEB1 and the second drive signal BLEB2 in response to an internal signal BLEQ_EN of an active command mode. The internal signal BLEQ_EN of the active command mode is a normal asynchronous signal generated from an internal circuit.

The overdriving control unit 100 includes a level shifting unit 410 and a pulse signal generation unit 420. The level shifting unit 410 receives the internal signal BLEQ_EN of the active command mode and generates an output signal BLEQ_ENH of the overdriving voltage VPP level in response to the internal signal BLEQ_EN. The level shifting unit 410 is composed of a normal cross-coupled differential amplification circuit. The pulse signal generation unit 420 generates the first drive signal BLEB1 for pulsing over a predetermined duration of an activation period and the second drive signal BLEB2 for pulsing over the other activation period after the pulsing duration of the first pulse signal BLEB1 in response to the output signal BLEQ_ENH of the overdriving voltage VPP level.

Pulse forms of the first and the second drive signals BLEB1 and BLEB2 generated from the overdriving control unit 100 are shown in a timing diagram 420 of FIG. 5. The first drive signal BLEB1 is activated to a logic low level for a predetermined duration in an early stage of the activation period of the internal signal BLEQ_EN and the second drive signal BLEB2 is activated to the logic low level for the other duration of the internal signal BLEQ_EN of the active command mode.

Figure 6:
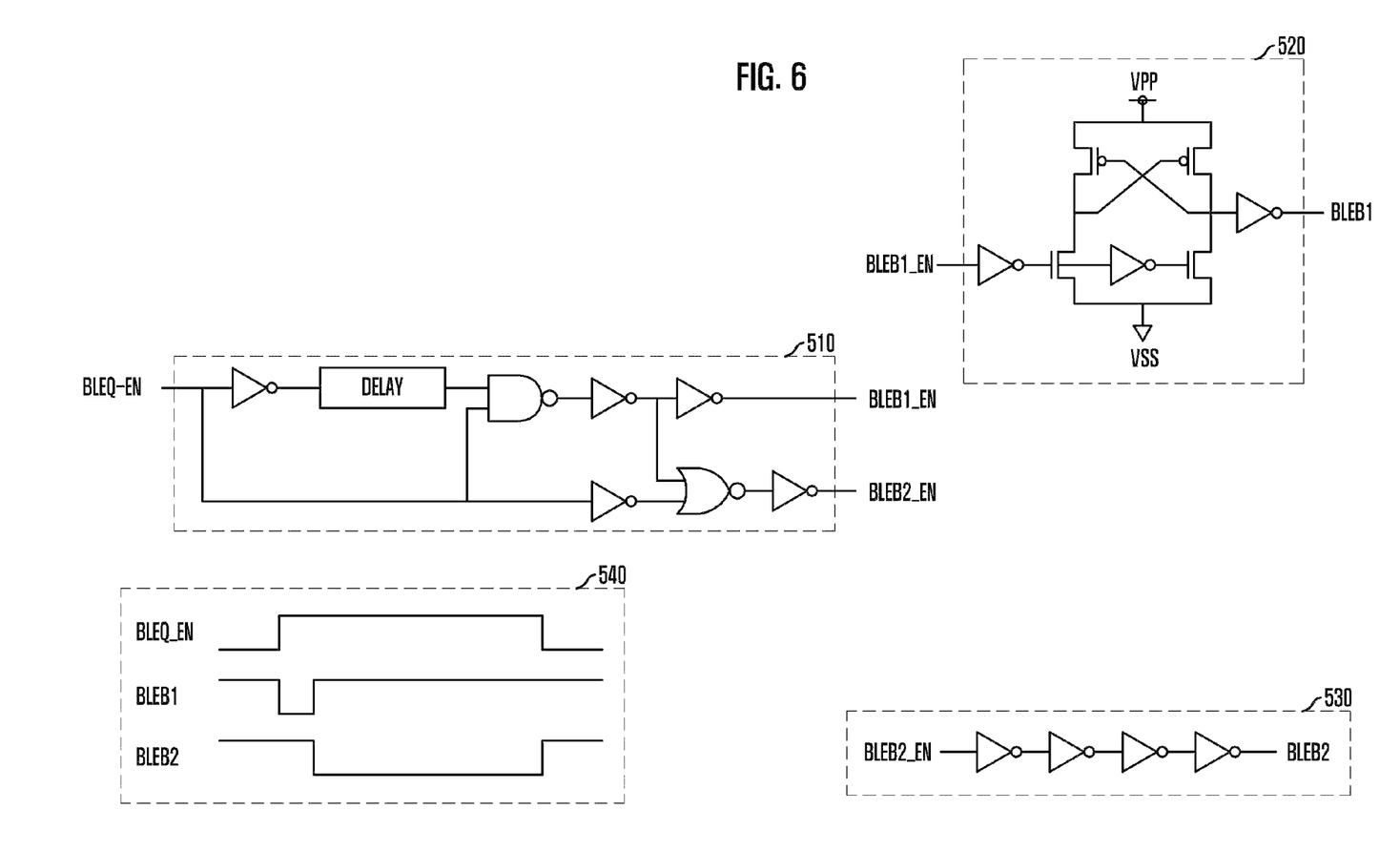
FIG. 6 is a circuit diagram in accordance with a second embodiment of an overdriving control unit shown in FIG. 4.

FIG. 6 is a circuit diagram in accordance with a second embodiment of the overdriving control unit shown in FIG. 4. As shown, the overdriving control unit 100 generates the first and second drive signals BLEB1 and BLEB2 in response to the internal signal BLEQ_EN of the active command mode. The internal signal BLEQ_EN is a normal asynchronous signal generated from the internal signal when the active command is applied. The overdriving control unit 100 includes a pulse signal generation unit 510, a level shifting unit 520 and a delay unit 530. The pulse signal generation unit 510 generates a first pulse output signal BLEB1_EN for pulsing over a predetermined duration of the activation period of the internal signal BLEQ_EN and a second pulse output signal BLEB2_EN for pulsing over the other activation period after the pulsing duration of the first pulse output signal BLEB1_13 EN. The level shifting unit 520 receives the first pulse output signal BLEB1_EN and generates the first drive signal BLEB1 of the overdriving voltage VPP level in response to the first pulse output signal BLEB1_EN. The level shifting unit 520 is composed of a normal cross-coupled type differential amplification circuit. The delay unit 530 delays the second pulse output signal BLEB2_EN for a predetermined time and generates the second drive signal BLEB2. The delay unit 530 is configured with an inverter-chain type, and generates the second drive signal BLEB2 by delaying the second pulse output signal BLEB2_EN properly to adjust skew with the first drive signal BLEB1.

Pulse forms of the first drive signal BLEB1 and the second drive signal BLEB2 generated from the overdriving control unit are shown in a timing diagram 530 of FIG. 6. The first drive signal BLEB1 is activated to the logic low level for a predetermined duration in an early stage of the activation period of the active command mode. The second drive signal BLEB2 is activated to the logic low level for the other period of the internal signal BLEQ_EN of the active command mode.

Figure 7:
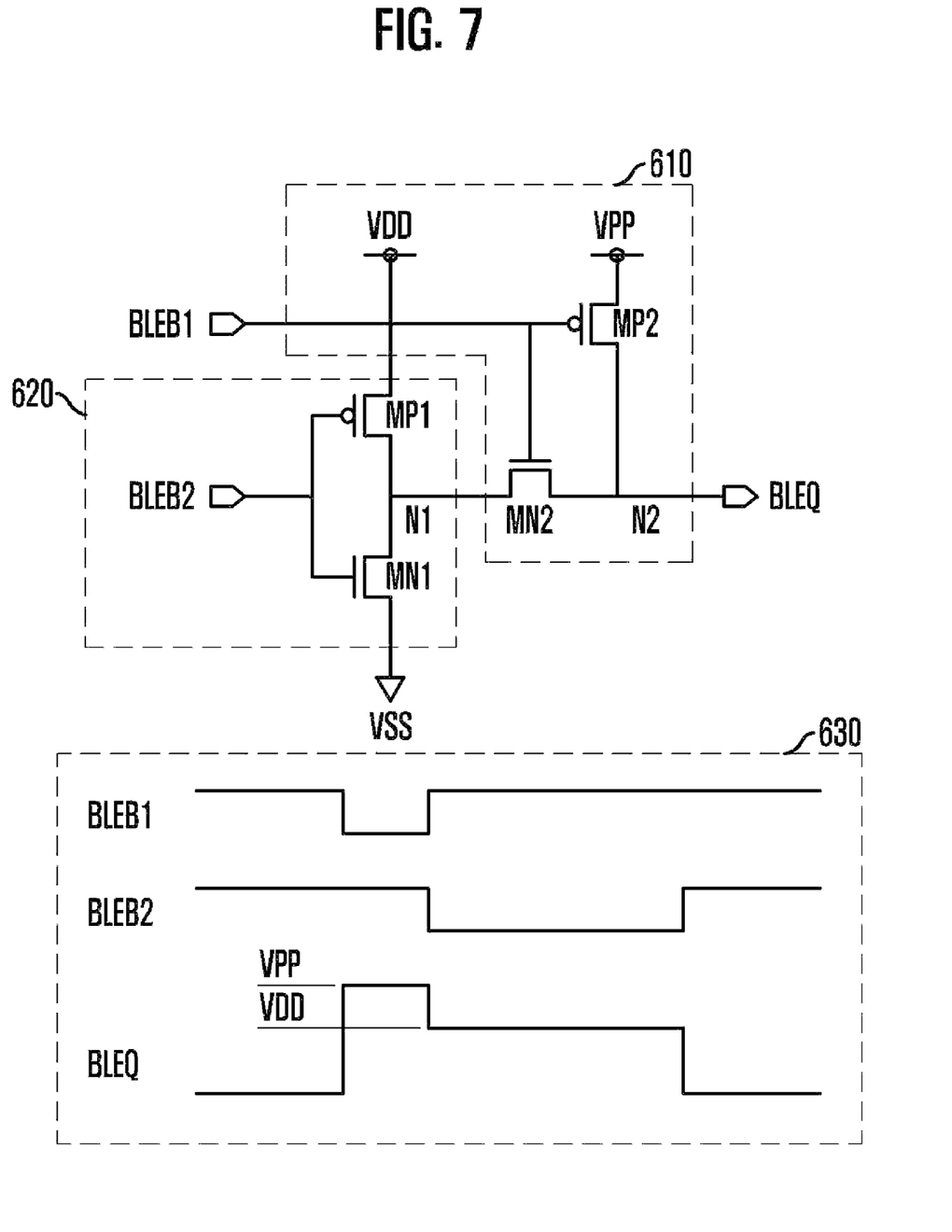
FIG. 7 is a circuit diagram of an equalizing signal generating unit shown in FIG. 4.

FIG. 7 is a circuit diagram in accordance with an embodiment of the equalizing signal generating unit shown in FIG. 4. As shown, the equalizing signal generating unit 200 includes a first drive unit 610 and a second drive unit 620. The first drive unit 610 outputs the overdriving voltage VPP to a second node N2 in response to the first drive signal BLEB1. The second drive unit 620 outputs the normal drive voltage VDD to a first node N1 in response to the second drive signal BLEB2. The second drive unit 620 includes a first PMOS transistor MP1 and a first NMOS transistor MN1. The first PMOS transistor MP1 forms a current path between the normal drive voltage VDD terminal and a first node N1 in response to the second drive signal BLEB2. The first NMOS transistor MN1 forms a current path between the first node N1 and a ground voltage VSS terminal in response to the second drive signal BLEB2. The first drive unit 610 includes a second NMOS transistor MN2 and a second PMOS transistor MP2. The second NMOS transistor MN2 forms a current path between the first node N1 and the second node N2 in response to the first drive signal BLEB1. The second PMOS transistor MP2 forms a current path between the overdriving voltage VPP terminal and the second node N2 in response to the first drive signal BLEB1.

A form of the equalizing signal BLEQ generated from the equalizing signal generating unit is shown in a timing diagram of FIG. 7. The equalizing signal is maintained to the overdriving voltage VPP level higher than the normal drive voltage VDD for a first duration of an early stage of the activation period and is maintained to the normal drive voltage VDD level for a second duration of the other activation period after the first duration.

Figure 8:
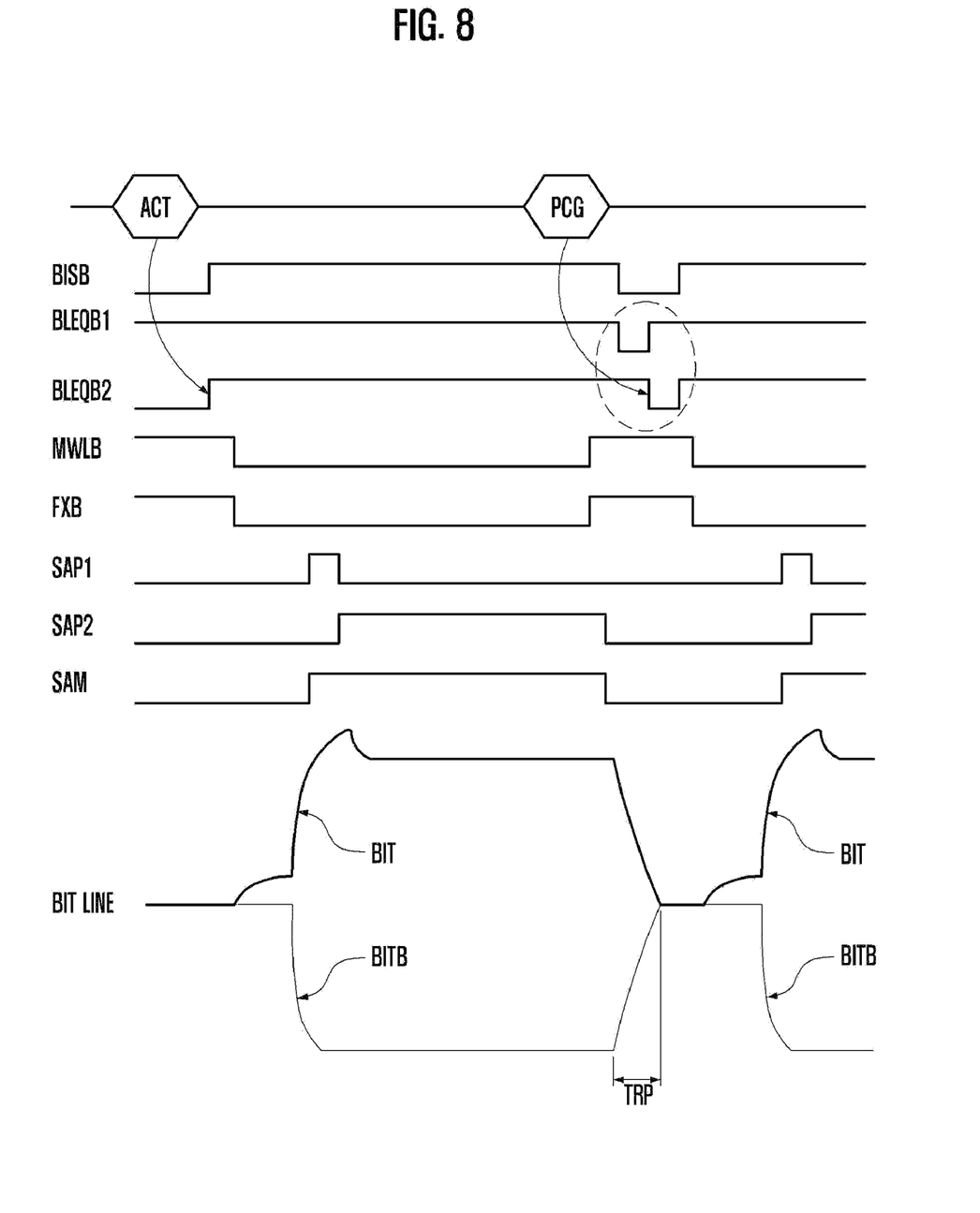
FIG. 8 is a timing diagram illustrating internal operations of a semiconductor memory device in accordance with an embodiment of the invention.

FIG. 8 is a timing diagram illustrating an internal operation of a semiconductor memory device in accordance with an embodiment of the invention.

As shown, a precharge command PCG is applied, the equalizing unit is controlled by the equalizing signal generated in response to the first drive signal BLEQB1 and the second drive signal BLEQB2. The equalizing unit performs an equalizing operation in response to the equalizing signal of the overdriving voltage VPP level during the early activation period and the equalizing signal of the normal drive voltage VDD level during the other activation period. Accordingly, an equalizing time of a pair of bit lines is reduced by using a high voltage level at an early period. Power consumption is reduced by using a low voltage level after the early activation period.

BISB, MWLB, FXB, SAP1 and SAP2 in FIG. 8 are a bit line separation signal, a main word line, a row decoding signal, a first sense amplifying control pulse and a second sense amplifying control pulse, respectively. SAM is a signal representing a period that either SAP1 or SAP2 is at a high logic level.

While the invention has been described with respect to the specific embodiments, it will be apparent to those skilled in the art that various changes and modifications may be made without departing from the spirit and scope of the invention as defined in the following claims.

For example, the logic states of the activation of a signal may be different according to embodiments. In addition, the configurations of the transistors may also be different according to required functions. That is, a PMOS transistor may be replaced with an NMOS transistor, and the number of the transistors may also be modified according to need. Such modifications of the circuit are quite various and can be easily designed by those skilled in the art from the above embodiments. Therefore, descriptions thereof are omitted herein.

What is claimed is:

1. A semiconductor device, comprising:
   an overdriving control circuit configured to generate a first drive signal and a second drive signal in response to an internal signal;
   an equalizing signal generating unit configured to generate an equalizing signal having an overdriving voltage higher than a normal drive voltage during a first duration of an activation period of the internal signal and having the normal drive voltage during a second duration of the activation period after the first duration in response to the first drive signal and the second drive signal; and
   an equalizing unit configured to equalize first and second lines in response to the equalizing signal,
   wherein the equalizing signal generating unit includes:
      a first drive unit configured to output the overdriving voltage to a second node in response to the first drive signal; and
      a second drive unit configured to output the normal drive voltage to a first node in response to the second drive signal,
   wherein the second drive unit includes:
      a first transistor configured to form a current path between a terminal supplying the normal drive voltage and the first node in response to the second drive signal; and
      a second transistor configured to form a current path between the first node and a ground voltage terminal in response to the second drive signal.

2. The semiconductor device as recited in claim 1, wherein the overdriving voltage is internally generated by using the normal drive voltage provided from outside the semiconductor device.

3. The semiconductor device as recited in claim 1, wherein the overdriving control circuit includes:
   a level shifting unit configured to receive the internal signal and to generate an output signal having the overdriving voltage in response to the internal signal; and
   a pulse signal generation unit configured to generate the first drive signal having a pulse occurring in an early stage of an activation period of the output signal of the level shifting unit and the second drive signal having a pulse occurring in a later stage of the activation period of the output signal of the level shifting unit.

4. The semiconductor device as recited in claim 3, wherein the level shifting unit is a cross-coupled type differential amplification circuit.

5. The semiconductor device as recited in claim 1, wherein the first drive unit includes:

a third transistor configured to form a current path between the first node and the second node in response to the first drive signal; and a fourth transistor configured to form a current path between a terminal supplying the overdriving voltage and the second node in response to the first drive signal.

6. The semiconductor device as recited in claim 1, wherein the first line is a positive bit line and the second line is a negative bit line.

7. The semiconductor device as recited in claim 6, wherein the equalizing unit includes:

a plurality of precharge transistors configured to apply a precharge voltage to the positive and negative bit lines in response to the equalizing signal; and an equalizing transistor configured to form a current path between the positive bit line and the negative bit line in response to the equalizing signal.

8. The semiconductor device as recited in claim 1, wherein the first line is a pull-up power line of a bit line sense amplification unit and the second line is a pull-down power line of the bit line sense amplification unit.

9. The semiconductor device as recited in claim 8, wherein the equalizing unit includes:

a plurality of precharge transistors configured to apply a precharge voltage to the pull-up power line and the pull-down power line of the bit line sense amplification unit in response to the equalizing signal.

10. The semiconductor device as recited in claim 1, wherein the first line is a first data transfer line for transferring data to a positive bit line and the second line is a second data transfer line for transferring data to a negative bit line.

11. The semiconductor device as recited in claim 10, wherein the equalizing unit includes:

a plurality of precharge transistors configured to apply a precharge voltage to the first data transfer line and the second data transfer line in response to the equalizing signal; and an equalizing transistor configured to form a current path between the first data transfer line and the second data transfer line in response to the equalizing signal.

12. A semiconductor device, comprising:

an overdriving control circuit configured to generate a first drive signal and a second drive signal in response to an internal signal;

a first drive unit configured to output an overdriving voltage higher than a normal drive voltage to a second node in response to the first drive signal;

a second drive unit configured to output the normal drive voltage to a first node in response to the second drive signal; and an equalizing unit configured to equalize first and second lines in response to an equalizing signal provided by the first and second drive units, wherein the first and second nodes are coupled to each other through a transistor and the transistor has a gate for receiving the first drive signal.

13. The semiconductor device as recited in claim 12, wherein the overdriving control circuit includes:

a level shifting unit configured to receive the internal signal and to generate an output signal having the overdriving voltage in response to the internal signal; and a pulse signal generation unit configured to generate the first drive signal having a pulse occurring in an early stage of an activation period of the output signal of the level shifting unit and the second drive signal having a pulse occurring in a later stage of the activation period of the output signal of the level shifting unit.

14. A semiconductor device, comprising:

a level shifting unit configured to receive an internal signal and to generate an output signal having an overdriving voltage higher than a normal drive voltage in response to the internal signal;

a pulse signal generation unit configured to generate a first drive signal having a pulse occurring in an early stage of an activation period of the internal signal and a second drive signal having a pulse occurring in a later stage of the activation period;

an equalizing signal generating unit configured to generate an equalizing signal having the overdriving voltage during a first duration of the activation period and having the normal drive voltage during a second duration of the activation period after the first duration in response to the first drive signal and the second drive signal; and an equalizing unit configured to equalize first and second lines in response to the equalizing signal, wherein the output signal of the level shifting unit is received by the pulse signal generation unit as an input signal and the pulse signal generating unit is further configured to delay the output signal of the level shifting unit.

15. The semiconductor device as recited in claim 3, wherein the output signal of the level shifting unit is received by the pulse signal generation unit as an input signal and the pulse signal generating unit is further configured to delay the output signal of the level shifting unit.

16. The semiconductor device as recited in claim 13, wherein the output signal of the level shifting unit is received by the pulse signal generation unit as an input signal and the pulse signal generation unit is further configured to delay the output signal of the level shifting unit.

17. The semiconductor device as recited in claim 1, wherein the first and second nodes are different nodes.

18. The semiconductor device as recited in claim 14, wherein the equalizing signal generating unit is further configured to output the overdriving voltage and the normal drive voltage at second and first nodes, respectively, and the first and second nodes are coupled to each other through a transistor and the transistor has a gate for receiving the first drive signal.

19. The semiconductor device as recited in claim 1, wherein the overdriving control circuit includes:

a pulse signal generation unit configured to generate a first pulse output signal and a second pulse output signal, wherein the first pulse output signal has a pulse occurring in the first duration and the second pulse output signal has a pulse occurring in the second duration after the first duration;

a level shifting unit configured to receive the first pulse output signal and to output the first drive signal having the overdriving voltage in response to the first pulse output signal; and a delay unit configured to delay the second pulse output signal for a predetermined time to output the second drive signal.

20. The semiconductor device as recited in claim 19, wherein the level shifting unit is a cross-coupled type differential amplification circuit.

* * * * *